(12) United States Patent
Falster et al.

(10) Patent No.: US 9,129,919 B2
(45) Date of Patent: Sep. 8, 2015

(54) PRODUCTION OF HIGH PRECIPITATE DENSITY WAFERS BY ACTIVATION OF INACTIVE OXYGEN PRECIPITATE NUCLEI

(71) Applicant: SunEdison Semiconductor Limited, St. Peters, MO (US)

(72) Inventors: Robert J. Falster, London (GB); Vladimir V. Voronkov, Merano (IT); Marco Cornara, Galliate (IT); Daniela Gambaro, Galliate (IT); Massimiliano Olmo, Novara (IT)

(73) Assignee: SunEdison Semiconductor Limited, Singapore (SG)

( * ) Notice: Subject to any disclaimer, the term of this patent is extended or adjusted under 35 U.S.C. 154(b) by 59 days.

(21) Appl. No.: 14/084,212

(22) Filed: Nov. 19, 2013

(65) Prior Publication Data

US 2014/0141537 A1 May 22, 2014

Related U.S. Application Data

(60) Provisional application No. 61/728,084, filed on Nov. 19, 2012.

(51) Int. Cl.
*H01L 21/322* (2006.01)
*H01L 21/324* (2006.01)
*H01L 21/66* (2006.01)
*C30B 29/06* (2006.01)
*C30B 33/02* (2006.01)

(52) U.S. Cl.
CPC .............. *H01L 21/324* (2013.01); *C30B 29/06* (2013.01); *C30B 33/02* (2013.01); *H01L 22/12* (2013.01)

(58) Field of Classification Search
CPC .............................. H01L 21/324; C30B 33/02
USPC ........................... 438/471, 492; 257/E21.318
See application file for complete search history.

(56) References Cited

U.S. PATENT DOCUMENTS

| 4,851,358 | A | 7/1989 | Huber |
| 5,024,723 | A | 6/1991 | Goesele et al. |
| 5,189,500 | A | 2/1993 | Kusunoki |
| 5,374,564 | A | 12/1994 | Bruel |

(Continued)

FOREIGN PATENT DOCUMENTS

| EP | 0732431 A1 | 9/1996 |
| EP | 1914795 A1 | 4/2008 |

OTHER PUBLICATIONS

Dannefaer et al., "Heat-treatment induced defects in CZ-silicon", Mat. Res. Soc. Symp. Proc. vol. 262, 1992 Materials Research Society.*

(Continued)

*Primary Examiner* — Kimberly Rizkallah
*Assistant Examiner* — Maria Ligai
(74) *Attorney, Agent, or Firm* — Armstrong Teasdale LLP

(57) ABSTRACT

Processes for the treatment of silicon wafers to form a high density non-uniform distribution of oxygen precipitate nuclei therein such that, upon being subjected to the heat treatment cycles of essentially any arbitrary electronic device manufacturing process, the wafers form oxygen precipitates in the bulk and a precipitate-free zone near the surface are disclosed. The processes involve activation of inactive oxygen precipitate nuclei by performing heat treatments between about 400° C. and about 600° C. for at least about 1 hour.

23 Claims, 3 Drawing Sheets

(56) References Cited

U.S. PATENT DOCUMENTS

| | | | |
|---|---|---|---|
| 5,436,175 | A | 7/1995 | Nakato et al. |
| 5,994,761 | A | 11/1999 | Falster et al. |
| 6,180,220 | B1 | 1/2001 | Falster et al. |
| 6,191,010 | B1 | 2/2001 | Falster |
| 6,204,152 | B1 | 3/2001 | Falster et al. |
| 6,277,501 | B1 * | 8/2001 | Fujikawa .................. 428/641 |
| 2002/0179006 | A1 | 12/2002 | Borgini et al. |
| 2003/0148634 | A1 | 8/2003 | Holzl et al. |
| 2003/0192469 | A1 * | 10/2003 | Libbert et al. .................. 117/2 |
| 2005/0005841 | A1 | 1/2005 | Falster et al. |
| 2005/0048247 | A1 * | 3/2005 | Mule'Stagno et al. ...... 428/64.1 |
| 2006/0189169 | A1 | 8/2006 | Adachi et al. |
| 2007/0105279 | A1 * | 5/2007 | Falster et al. ................. 438/113 |
| 2012/0001301 | A1 | 1/2012 | Ebara et al. |
| 2012/0039786 | A1 | 2/2012 | von Ammon et al. |

OTHER PUBLICATIONS

Porrini et al., "Influence of oxygen and oxygen related defects o nthe minority carrier lifetime of high purity CZ and MCZ silicon", Electrochemical Society Proceedings, vol. 96-13, pp. 170-175.*

N.E. Cheung, Plasma immersion ion implantation for semiconductor processing, Materials Chemistry and Physics, dated 1996, pp. 132-139.

R. Falster et al., Morphological Transformation of Oxide Particles and Thresholds for Effective Gettering in Silicon, Solid State Phenomena, dated 2005, pp. 6.

Robert Falster et al., Rapid Thermal Processing and the Control of Oxygen Precipitation Behaviour in Silicon Wafers, Materials Science Forum, dated 2008, pp. 45-60.

Fumio Shimura, Semiconductor silicon crystal technology, Passage Semiconductor Silicon Crystal Technology, dated Jan. 1, 1989, pp. 361-367.

Hideki Tsuya et al., Improved Intrinsic Gettering Technique for High-Temperature-Treated CZ Silicon Wafers, dated Jan. 5, 1981, pp. L31-L34.

International Search Report and Written Opinion, Application No. PCT/US2013/070771, dated Feb. 3, 2014, pp. 16.

* cited by examiner

PRODUCTION OF HIGH PRECIPITATE DENSITY WAFERS BY ACTIVATION OF INACTIVE OXYGEN PRECIPITATE NUCLEI

CROSS-REFERENCE TO RELATED APPLICATION

This application claims the benefit of U.S. Provisional Patent Application No. 61/728,084, filed Nov. 19, 2012, which is incorporated herein by reference.

BACKGROUND

This disclosure generally relates to the preparation of a semiconductor material substrate, especially a silicon wafer, which is suitable for use in the manufacture of electronic components. More particularly, the present disclosure relates to a process for the treatment of silicon wafers to form a high density non-uniform distribution of oxygen precipitate nuclei therein such that, upon being subjected to the heat treatment cycles of essentially any arbitrary electronic device manufacturing process, the wafers form oxygen precipitates in the bulk and a precipitate-free zone near the surface.

Single crystal silicon, which is the starting material for most processes for the fabrication of semiconductor electronic components, is commonly prepared with the so-called Czochralski (CZ) process wherein a single seed crystal is immersed into molten silicon and then grown by slow extraction. Molten silicon is contaminated with various impurities, among which is mainly oxygen, during the time it is contained in a quartz crucible. At the temperature of the silicon molten mass, oxygen comes into the crystal lattice until it reaches a concentration determined by the solubility of oxygen in silicon at the temperature of the molten mass and by the actual segregation coefficient of oxygen in the solidified silicon. Such concentrations are greater than the solubility of oxygen in solid silicon at temperatures typical for the processes used to fabricate electronic devices. As the crystal grows from the molten mass and cools, therefore, the solubility of oxygen in it decreases rapidly, whereby in the remaining slices or wafers, oxygen is present in supersaturated concentrations.

Thermal treatment cycles which are typically employed in electronic device manufacturing processes can cause the precipitation of oxygen in silicon wafers which are supersaturated in oxygen. Depending upon their location in the wafer and their relative size, the precipitates can be harmful or beneficial. Small oxygen clusters are electrically active thermal donors and can reduce resistivity regardless of location in the wafer. Large oxygen precipitates located in the active device region of the wafer can impair the operation of the device but when located in the bulk of the wafer, however, are capable of trapping undesired metal impurities that may come into contact with the wafer during, for example, device fabrication processes. This is commonly referred to as internal or intrinsic gettering ("IG").

Rapid thermal process that reliably and reproducibly form a distribution of oxygen precipitate nuclei that comprise crystal lattice vacancies which, in turn, establish a template for oxygen precipitation in silicon wafers have been developed (see, e.g., the work of Falster et al. described in U.S. Pat. Nos. 5,994,761; 6,191,010; and, 6,180,220; each of which is incorporated herein by reference for all relevant and consistent purposes). The "ideal precipitating process" generally yields a non-uniform distribution of oxygen precipitate nuclei, with the concentration in the wafer bulk being higher than in a surface layer. Upon a subsequent, oxygen precipitation heat treatment, the high concentration of nuclei in the wafer bulk form oxygen precipitate nucleation centers which aid in the formation and growth of oxygen precipitates with the concentration of nuclei in the near-surface region being insufficient to do so. As a result, a denuded zone forms in the near-surface region and oxygen precipitates, sometimes referred to as bulk microdefects or simply BMDs, form in the wafer bulk.

Denuded zones depth may be controlled by controlling the cooling rate of the wafer from the anneal temperature to the temperature at which crystal lattice vacancies become essentially immobile for any commercially practical time period. Thin denuded zones may be desirable over relatively thick denuded zones, particularly in high resistivity wafers as, in general, oxygen removal efficiency decreases with increasing denuded zone depth because the distance over which the interstitial oxygen must travel in order to be removed from solution (either by precipitating at a BMD or by diffusing to the wafer surface) increases. As a result, once a denuded zone becomes too deep or thick, there is the potential that the elevated interstitial oxygen concentration in the center of this zone (interstitial oxygen near the surface and bulk of the wafer having sufficient time to diffuse to sites where they are consumed) will be sufficiently high, such that thermal donor formation will occur during a device manufacturing process, thus decreasing resistivity in the device layer of the wafer. This may be particularly problematic in wafers having deep denuded zones. Furthermore, the cooling rates required to achieve thin denuded zones are somewhat extreme and the thermal shock may create a risk of shattering the wafer.

A continuing need exists for new methods for producing ideal precipitating wafers, the methods allowing for less robust rapid thermal anneals to be performed thereby increasing processing throughput and/or methods that result in formation of thin denuded zones without increasing the cooling rate of the wafer.

SUMMARY

One aspect of the present disclosure is directed to a process for heat-treating a single crystal silicon wafer sliced from a single crystal silicon ingot grown by the Czochralski method to influence the precipitation behavior of oxygen in the wafer in a subsequent thermal processing step. The silicon wafer has a front surface, a back surface, a central plane between the front and back surfaces, a front surface layer which comprises the region of the wafer extending in the axial direction from the front surface toward the central plane to a distance, D, from the front surface, and a bulk layer which comprises the region of the wafer between the central plane and front surface layer. The wafer is subjected to a heat-treatment to install in the wafer a concentration of oxygen precipitate nuclei comprising crystal lattice vacancies in the front surface and bulk layers of the wafer. At least a portion of the oxygen precipitate nuclei are inactive oxygen precipitate nuclei and a portion are active oxygen precipitate nuclei. The oxygen precipitate nuclei are characterized such that upon being subjected to an NEC1 oxygen precipitation heat treatment, active oxygen precipitate nuclei are converted to oxygen precipitates and inactive oxygen precipitate nuclei do not form oxygen precipitates. The cooling rate of the heat-treated wafer is controlled to produce a wafer having a concentration profile of oxygen precipitate nuclei wherein the maximum concentration is in the bulk region with the concentration generally decreasing in the direction of the front surface of the wafer and the difference in the concentration of oxygen precipitate nuclei in the front surface and bulk layers being such that, if the wafer is subjected to a subsequent oxygen precipitation heat treatment, an oxygen precipitate-free denuded zone is formed in the front surface layer and oxygen precipitates are formed in the bulk layer with the concentration of the oxygen precipitates in the bulk layer being primarily dependent upon the oxygen precipitate nuclei. The wafer is subjected to a heat treatment at a temperature of at least about 400° C. and no greater than about 600° C. for at least about 1 hour to activate at least a portion of the inactive oxygen precipitate nuclei in the wafer.

Another aspect of the present disclosure is directed to a process for activating inactive oxygen precipitate nuclei, which comprise crystal lattice vacancies, in a wafer sliced from a single crystal silicon ingot grown by the Czochralski method. The wafer has a front surface, a back surface, a central plane between the front and back surfaces, a front surface layer which comprises the region of the wafer extending in the axial direction from the front surface toward the central plane to a distance, D, from the front surface, and a bulk layer which comprises the region of the wafer between the central plane and front surface layer. The wafer has a concentration of oxygen precipitate nuclei comprising crystal lattice vacancies in the front surface and bulk layers of the wafer. At least a portion of the oxygen precipitate nuclei are inactive oxygen precipitate nuclei and a portion are active oxygen precipitate nuclei. The oxygen precipitate nuclei are characterized such that upon being subjected to an NEC1 oxygen precipitation heat treatment, active oxygen precipitate nuclei are converted to oxygen precipitates and inactive oxygen precipitate nuclei do not form oxygen precipitate. The concentration profile of the oxygen precipitate nuclei is characterized such that the maximum concentration is in the bulk region with the concentration generally decreasing in the direction of the front surface of the wafer. The wafer is subjected to a heat treatment at a temperature of at least about 400° C. and no greater than about 600° C. for at least about 1 hour to activate the inactive oxygen precipitate nuclei such that they are capable of forming oxygen precipitates upon being subjected to an NEC1 oxygen precipitate heat treatment.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

DETAILED DESCRIPTION

Figure 1:
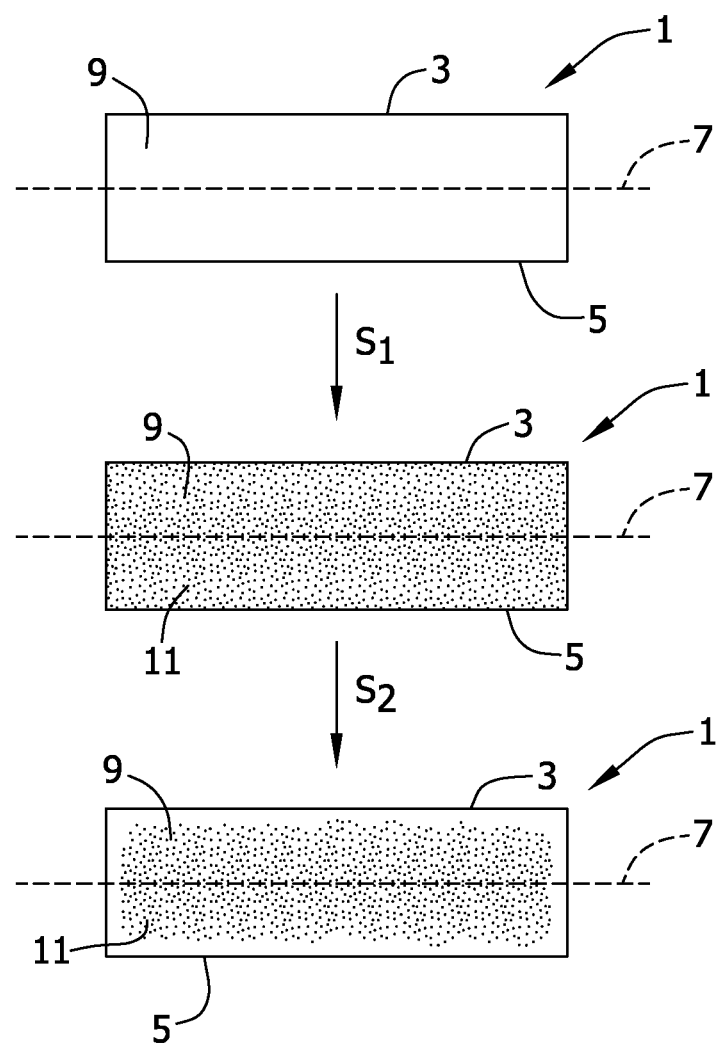
FIG. 1 is a schematic of a wafer subjected to a thermal anneal step $S_1$ and rapid cooling step $S_2$ to form a non-uniform distribution of vacancy-containing oxygen precipitate nuclei in the wafer.

In accordance with the present disclosure it has been found that two-types of oxygen precipitate nuclei containing crystal lattice vacancies form after a rapid thermal anneal is performed. The first type of oxygen precipitate nuclei behaves as conventionally-known nuclei in that the oxygen precipitate nuclei forms oxygen precipitates upon being subjected to an oxygen precipitation heat treatment (e.g., a NEC1 oxygen precipitation heat treatment). In contrast, the second type of oxygen precipitate nuclei that forms after the rapid thermal anneal does not form oxygen precipitates upon being subjected to an oxygen precipitation heat treatment (e.g., a NEC1 oxygen precipitation heat treatment). For purposes of the present disclosure, the first oxygen precipitate nuclei that forms oxygen precipitates upon an oxygen precipitation heat treatment is referred to herein as an "active" oxygen precipitate nuclei and the second oxygen precipitate nuclei that does not form oxygen precipitates upon an oxygen precipitation heat treatment is referred to herein as an "inactive" oxygen precipitate nuclei.

In this regard, it has been found that the inactive oxygen precipitate nuclei can be "activated" (synonymously "awakened") by heat treating the wafer at a temperature of at least about 400° C. and no greater than about 600° C. for at least about 1 hour to activate at least a portion of the inactive oxygen precipitate nuclei in the wafer. Without being bound by any particular theory, the activation heat treatment may cause a morphological change in the inactive oxygen precipitate nuclei causing them to convert to or act as an active oxygen precipitate nuclei in that the nuclei forms oxygen precipitates after an oxygen precipitation heat treatment is performed. Such activation heat treatments create a density of oxygen precipitate nuclei in the wafer that is relatively higher than conventional wafers that are not subjected to such a heat treatment. The activation process and the resulting activated oxygen precipitate nuclei allow the rapid thermal anneal used to produce the oxygen precipitate nuclei to be applied at a lower temperature compared to conventional processes but yet achieve an equivalent or even a higher density of oxygen precipitates.

Further in this regard, it should be understood that the activated oxygen precipitate nuclei may act similar to the conventionally-known active oxygen precipitate nuclei after activation is performed (i.e., both types of oxygen precipitate nuclei may become oxygen precipitates after an oxygen precipitation heat treatment (e.g., NEC1 oxygen precipitation heat treatment) is performed); however the two types of nuclei may behave differently in other aspects. For example, it has been found that the activated oxygen precipitate nuclei (i.e., the inactive nuclei that have been subjected to an activation heat treatment) diffuse slower than the active oxygen precipitate nuclei (i.e., the nuclei that form oxygen precipitates after an oxygen precipitation heat treatment without having an activation heat treatment being applied thereto). The slower diffusion of activated precipitate nuclei allows less nuclei to diffuse to the surface of the wafer which results in a thinner denuded zone after an oxygen precipitation heat treatment step is applied.

A. Wafer Starting Material

In some embodiments, the starting semiconductor wafer of the present disclosure is a silicon wafer which has been sliced from a single crystal ingot grown in accordance with conventional Czochralski ("CZ") crystal growing methods, typically having a diameter of about 150 mm, about 200 mm, about 300 mm, about 450 mm or more. The wafer may be polished or, alternatively, lapped and etched but not polished. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.,) Springer-Verlag, New York, 1982 (incorporated herein by reference for all relevant and consistent purposes). Preferably, the wafers are polished and cleaned by standard methods known to those skilled in the art (e.g., W. C. O'Mara et al., Handbook of Semiconductor Silicon Technology, Noyes Publications).

In general, the starting wafer may have an oxygen concentration falling anywhere within the range attainable by the CZ process, which is typically between about $5 \times 10^{17}$ and about $9 \times 10^{17}$ atoms/cm$^3$ or about 10 to about 18 PPMA (e.g., about 10 to about 12 or 15 PPMA, as determined in accordance with ASTM calibration; $O_i = 4.9\alpha$, where $\alpha$ is the absorption coefficient of the 1107 cm$^{-1}$ absorption band; new ASTM standard F-121-83). In addition, the starting wafer preferably has an absence of stabilized oxygen precipitates (i.e., oxygen precipitates which cannot be dissolved or annealed out of the wafer at a temperature of about 1200° C. or less) in the near-surface region of the wafer.

Substitutional carbon, when present as an impurity in single crystal silicon, has the ability to catalyze the formation of oxygen precipitate nucleation centers. For this and other reasons, therefore, it is preferred that the single crystal silicon starting material have a low concentration of carbon. That is, the single crystal silicon preferably has a concentration of carbon which is less than about $5 \times 10^{16}$ atoms/cm$^3$, preferably which is less than $1 \times 10^{16}$ atoms/cm$^3$, and more preferably less than $5 \times 10^{15}$ atoms/cm$^3$.

B. Process for Creating a Template for Oxygen Precipitation

In accordance with the present disclosure, a rapid thermal treatment is carried out to form a distribution of oxygen precipitate nuclei which establish a template for oxygen precipitation in the wafer. In one or more embodiments, the template is for a wafer having oxygen precipitates in the wafer bulk but a low density of, and preferably an essential absence of, oxygen precipitates in a near-surface region which may be referred to herein as a "denuded zone." Advantageously, denuded zones of any desired depth may be obtained. For example, denuded zone depths ranging from about 10 µm or less to about 100 µm or more may be obtained.

In this regard, the oxygen precipitate nuclei that form generally contain crystal lattice vacancies as a part of the nuclei. The vacancies may be associated (i.e., bonded and/or grouped with) oxygen such as an oxygen dimer ($O_2$); however, it should be understood that the present disclosure is not limited to any structural and/or morphological-specific oxygen precipitate nuclei. For example, the oxygen precipitate nuclei may be a vacancy alone or may be bound as VO. As used herein, "oxygen precipitate nuclei" refers to any structural unit which forms oxygen precipitates upon an oxygen precipitation heat treatment or forms such precipitates after being activated and "oxygen precipitate nuclei" as used herein should not be considered in a limiting sense.

The use of a rapid thermal process to form a distribution of oxygen precipitate nuclei which, in turn, establish a template for oxygen precipitation, is generally described in U.S. Pat. Nos. 5,994,761; 6,191,010 and 6,180,220, each of which is incorporated herein by reference for all relevant and consistent purposes. The "ideal precipitating process" described therein typically yields a non-uniform distribution of oxygen precipitate nuclei, with the concentration in the wafer bulk being higher than in a surface layer. Upon a subsequent oxygen precipitation heat treatment, the high concentration of nuclei in the wafer bulk form oxygen precipitate nucleation centers which aid in the formation and growth of oxygen precipitates, the concentration of nuclei in the near-surface region being insufficient to do so. As a result, a denuded zone forms in the near-surface region and oxygen precipitates, sometimes referred to as bulk microdefects, form in the wafer bulk. As described therein, denuded zones of a depth in the range of about 10 µm to about 100 µm may reliably be formed.

Referring now to FIG. 1, the starting material suitable for use in accordance with the present disclosure is a single crystal silicon wafer 1, having a front surface 3, a back surface 5, an imaginary central plane 7 between the front and back surfaces, and a wafer bulk 9 comprising the wafer volume between the front and back surfaces. The terms "front" and "back" in this context are used to distinguish the two major, generally planar surfaces of the wafer; the front surface of the wafer as that term is used herein is not necessarily the surface onto which an electronic device will subsequently be fabricated nor is the back surface of the wafer as that term is used herein necessarily the major surface of the wafer which is opposite the surface onto which the electronic device is fabricated. In addition, because silicon wafers typically have some total thickness variation, warp and bow, the midpoint between every point on the front surface and every point on the back surface may not precisely fall within a plane; as a practical matter, however, the TTV, warp and bow are typically so slight that to a close approximation the midpoints can be said to fall within an imaginary central plane which is approximately equidistant between the front and back surfaces.

In general, in step $S_1$ of the process for forming a non-uniform distribution of vacancy-containing oxygen precipitate nuclei, the silicon wafer 1 is subjected to a heat-treatment step in which the wafer is heated to an elevated temperature to form and thereby increase the number density of oxygen precipitate nuclei containing vacancies 11 in wafer 1. Preferably, this heat-treatment step is carried out in a rapid thermal annealer in which the wafer is rapidly heated to a target temperature and annealed at that temperature for a relatively short period of time. As the process of the present disclosure generally creates a higher density of oxygen precipitate nuclei due to activation of inactive nuclei, a rapid thermal anneal as low as 1100° C. may be applied. In this regard, temperatures of at least about 1100° C., at least about 1175° C., at least about 1200° C. or at least about 1300° C. (e.g., from about 1100° C. to about 1400° C., from about 1100° C. to about 1300° C., or from about 1100° C. to about 1200° C.) may be used. The wafer will generally be maintained within these temperature ranges for at least about 1 second and typically for at least several seconds (e.g., at least about 3 seconds or at least about 5 seconds or more) or even several tens of seconds (e.g., at least about 20 seconds, at least about 30 seconds, at least about 40 seconds or more) and, depending upon the desired characteristics of the wafer and the atmosphere in which the wafer is being annealed, for a period which may range up to about 60 seconds which is near the limit for commercially available rapid thermal annealers. Maintaining the wafer at an established temperature during the anneal for additional time does not appear, based upon experimental evidence obtained to-date, to lead to an increase in vacancy concentration.

During the heat treatment step $S_1$, the wafer may be exposed to an atmosphere comprising a gas or gases selected to produce an oxygen precipitate nuclei concentration profile which is relatively uniform. In some embodiments, a relatively uniform vacancy concentration profile may be produced by heat-treating the wafer 1 in a non-nitriding and non-oxidizing atmosphere (i.e., an inert atmosphere). When a non-nitrogen/non-oxygen-containing gas is used as the atmosphere or ambient in the rapid thermal annealing step and cooling step described below, the increase in nuclei concentration throughout the wafer is achieved soon after, if not immediately upon, achieving the annealing temperature. The profile of the resulting nuclei concentration (number density) in the wafer during the heat treatment is relatively constant from the front of the wafer to the back of the wafer. Suitable gases include argon, helium, neon, carbon dioxide, and other such inert elemental and compound gases, or mixtures of such gases.

In several embodiments, the non-nitriding/non-oxidizing atmosphere preferably has no more than a relatively small partial pressure of oxygen, water vapor and other oxidizing gases. That is, the atmosphere has a total absence of oxidizing gases or a partial pressure of such gases which is insufficient to inject sufficient quantities of silicon self-interstitial atoms which suppress the build-up of vacancy concentrations. While the lower limit of oxidizing gas concentration has not been precisely determined, it has been demonstrated that for partial pressures of oxygen of 0.01 atm, or 10,000 parts per million atomic (ppma), no increase in vacancy concentration and no effect is observed. Thus, it is preferred that the atmosphere has a partial pressure of oxygen and other oxidizing gases of less than about 0.01 atm (10,000 ppma), less than about 0.005 atm (5,000 ppma), less than about 0.002 atm (2,000 ppma) or, most preferably, less than about 0.001 atm (1,000 ppma).

In other embodiments, a relatively uniform vacancy concentration profile may be produced by heat-treating the wafer 1 in an oxygen-containing atmosphere in step $S_O$ to grow a superficial oxide layer which envelopes the wafer 1 prior to heat treatment step $S_1$. In general, the oxide layer will have a thickness which is greater than the native oxide layer which forms upon silicon (about 15 Å). The thickness of the superficial oxide layer is typically at least about 20 Å and, in some embodiments, the wafer will have an oxide layer that is at least about 25 Å or at least about 30 Å thick. Experimental evidence obtained to date, however, suggests that oxide layers having a thickness greater than about 30 Å provide little or no additional benefit.

In embodiments wherein a superficial oxide layer is formed on the wafer, after forming the oxide layer, the rapid thermal annealing step $S_1$ is typically carried out in the presence of a nitriding atmosphere, that is, an atmosphere containing nitrogen gas ($N_2$) or a nitrogen-containing compound gas such as ammonia which is capable of nitriding an exposed silicon surface. Alternatively, or in addition, the atmosphere may comprise a non-oxidizing and non-nitriding gas such as argon. An increase in vacancy-containing oxygen precipitate nuclei throughout the wafer is achieved soon after, if not immediately upon, achieving the annealing temperature and the nuclei concentration profile is relatively uniform.

After the rapid thermal annealing step $S_1$, the wafer has a surface layer which comprises the region of the wafer between the front surface and a distance, D, measured from the front surface and toward the central plane, and a bulk layer which comprises a second region of the wafer between the central plane and the surface layer, wherein the surface layer and bulk layer have a concentration of oxygen precipitate nuclei comprising crystal lattice vacancies. At least a portion of the oxygen precipitate nuclei are inactive oxygen precipitate nuclei and a portion are active oxygen precipitate nuclei.

Upon completion of the rapid thermal annealing step $S_1$, the wafer, in step $S_2$, is rapidly cooled through the range of temperatures at which vacancy-containing oxygen precipitate nuclei and, in particular, in which vacancies themselves are relatively mobile in the single crystal silicon. Vacancy-containing oxygen precipitate nuclei are typically mobile in silicon within a commercially practical period of time down to temperature in excess of about 700° C., in excess of about 800° C., in excess of about 900° C. or even in excess of about 1000° C. As the temperature of the wafer is decreased through this range of temperatures, the vacancy-containing nuclei diffuse to the surface of the wafer and/or the oxide layer on the wafer surface and become annihilated, thus leading to a change in the nuclei concentration profile with the extent of change depending upon the length of time the wafer is maintained at a temperature within this range. If the wafer was held at a temperature within this range for an infinite period of time, the nuclei concentration profile would once again become similar to the initial profile of step $S_1$ (e.g., uniform) but the equilibrium concentration would be less than the concentration immediately upon completion of the heat treatment step. However, as further described herein, by rapidly cooling the wafer, either alone or in conjunction with control of the ambient in which the wafer is heat-treated and cooled, a non-uniform distribution of oxygen precipitate nuclei can be achieved, the concentration in the wafer bulk being greater than the concentration in a region near the surface. For example, process conditions (e.g., cooling rate) may be controlled, for example, such that the maximum nuclei concentration is a distance of at least about 10 μm, at least about 20 μm, at least about 30 μm, at least about 40 μm, at least about 50 μm, at least about 70 μm or more from the wafer surface. In one embodiment, the maximum concentration of oxygen precipitate nuclei containing vacancies is at or near a central plane 7, the nuclei concentration generally decreasing in the direction of the front surface 3 and back surface 5 of the wafer. In a second embodiment, the maximum nuclei concentration is between the central plane 7 and a layer or region near either of the surface 3, 5 of the wafer, the concentration generally decreasing in the direction of both the surface and the central plane.

In this regard it is to be further noted that, in general, a "denuded zone" as used herein is a zone occupying the region near the surface of a wafer which has (i) an absence of oxygen precipitates in excess of the current detection limit (currently about $10^7$ oxygen precipitates/$cm^3$) and (ii) a low concentration of, and preferably an essential absence of oxygen precipitate nuclei which, upon being subjected to an oxygen precipitation heat-treatment, are converted to oxygen precipitates. Wafers having an essential absence of oxygen precipitate nucleation centers shall mean wafers which, upon being annealed at a temperature of 800° C. for four hours and then at a temperature of 1000° C. for sixteen hours has less than $10^7$ oxygen precipitates/$cm^3$.

Conveniently, the cooling step $S_2$ may be carried out in the same atmosphere in which the heating step $S_1$ is carried out. However, it may be carried out in a different atmosphere which may modify the shape of the nuclei concentration profile. Regardless of the selected atmosphere, the effect of rapidly cooling the wafer predominates atmospheric factors and results in a significant decrease in the concentration of vacancies in the near surface regions. The rapid thermal annealing step $S_1$ and cooling step $S_2$ may be carried out in, for example, any of a number of commercially available rapid thermal annealing ("RTA") furnaces in which wafers are individually heated by banks of high power lamps. RTA furnaces are capable of rapidly heating a silicon wafer, for example, from room temperature to about 1200° C. in a few seconds.

In general, the average cooling rate within the range of temperatures in which oxygen precipitate nuclei are mobile is at least about 5° C. per second or, as in other embodiments, at least about 20° C. per second, at least about 50° C. per second, at least about 100° C. per second or even at least about 150° C. per second or more (e.g., from about 20° C. per second to about 200° C. per second, from about 20° C. per second to about 100° C. per second or from about 100° C. per second to about 200° C. per second). Typically, current processing equipment results in a cooling rate between about 30° C. and about 80° C. per second and more typically between about 40° C. and about 50° C. per second. In this regard it is to be noted that, once the wafer is cooled to a temperature outside the range of temperatures at which vacancy-containing oxygen precipitate nuclei are relatively mobile in the single crystal silicon, the cooling rate does not appear to significantly influence the precipitating characteristics of the wafer and thus does not appear to be narrowly critical.

After $S_2$, the wafer has a concentration profile of oxygen precipitate nuclei wherein the maximum concentration is in the bulk region with the concentration generally decreasing in the direction of the front surface of the wafer. The difference in the concentration of oxygen precipitate nuclei in the front surface and bulk layers is such that, if the wafer is subjected to a subsequent oxygen precipitation heat treatment, an oxygen precipitate-free denuded zone is formed in the front surface layer and oxygen precipitates are formed in the bulk layer with the concentration of the oxygen precipitates in the bulk layer being primarily dependent upon the oxygen precipitate nuclei. The distance, D, from the front surface to the central plane in which the front surface layer extends may be 10 µm or less or even about 100 µm or more. In some embodiments, D is at least about 10 µm, at least about 20 µm, at least about 30 µm, at least about 40 µm, at least about 50 µm, at least about 70 µm or at least about 100 µm (e.g., from about 1 µm to about 200 µm, from about 10 µm, to about 200 µm, from about 10 µm to about 100 or from about 10 µm to about 50 µm).

In this regard, the precise conditions for the annealing and cooling steps may be other than herein described without departing from the scope of the present disclosure. Furthermore, such conditions may be determined, for example, empirically by adjusting the temperature and duration of the anneal, and the atmospheric conditions (i.e., the composition of the atmosphere, as well as the oxygen partial pressure) in order to control the desired depth of the denuded zone.

Further in this regard, it should be understood that the oxygen precipitate nuclei profiles described above are the combined profiles for active and inactive oxygen precipitate nuclei as the heat treatment step $S_1$ and cooling step $S_2$ affect active and inactive nuclei in a similar manner. While both active and inactive oxygen precipitate nuclei cannot be detected or measured directly using presently available techniques, they may be indirectly measured, however, if oxygen precipitates are grown at these sites by subjecting the silicon wafer to an oxygen precipitation heat treatment. For instance, active oxygen precipitate nuclei may be detected by subjecting the wafer in which the oxygen precipitate nuclei profile was altered to a NEC1 oxygen precipitation heat treatment in which the wafer is annealed at a temperature of 800° C. for four hours and then at a temperature of 1000° C. for sixteen hours (without subjecting the wafer to an intervening nuclei activation process) and by measuring the number of oxygen precipitates that formed (e.g., determining the number of bulk micro defects after an etching treatment).

Inactive oxygen precipitate nuclei may be detected by subjecting the wafer in which the oxygen precipitate nuclei profile was altered to a nuclei activation process as described below followed by a NEC1 oxygen precipitation heat treatment in which the wafer is annealed at a temperature of 800° C. for four hours and then at a temperature of 1000° C. for sixteen hours and by measuring the number of oxygen precipitates that formed and comparing the number to a wafer in which the nuclei activation step was not performed. An increase in oxygen precipitate density beyond which may be attributed to conventional nucleation indicates that a number of inactive nuclei were activated during the activation process.

In this regard, the increase in oxygen precipitate density which may be attributed to conventional nucleation may be determined by heating a non-oxygen precipitating wafer with the same oxygen content to the activation temperature described below for a period of time followed by an NEC1 oxygen precipitation heat treatment in which the wafer is annealed at a temperature of 800° C. for four hours and then at a temperature of 1000° C. for sixteen hours and by measuring the number of oxygen precipitates that formed. Such non-oxygen precipitating wafers may be produced by subjecting a starting wafer to a heat treatment in which existing oxygen clusters and precipitates are dissolved and in which formation of clusters and precipitates is prevented during subsequent oxygen precipitation heat treatments such as by the methods disclosed in U.S. Pat. No. 6,336,968 which is incorporated herein by reference for all relevant and consistent purposes.

In some embodiments of the present disclosure, inactive and active oxygen precipitate nuclei may be stabilized such that they are incapable of being dissolved at a temperature less than about 1150° C. Any method available to those of skill in the art for stabilizing oxygen precipitate nuclei may be used and, in some particular embodiments, the nuclei are stabilized according to the methods disclosed in U.S. Pat. No. 6,955,718 which is incorporated herein by reference for all relevant and consistent purposes.

C. Process for Activating Inactive Vacancy-Containing Oxygen Precipitate Nuclei

After the heat treatment step $S_1$ and cooling step $S_2$ are performed, the wafer is subjected to an activation step $S_3$ in which the wafer is heated to a temperature sufficient to activate the inactive vacancy-containing oxygen precipitate nuclei. Inactive oxygen precipitate nuclei may be activated at temperatures as low as about 400° C.; however higher temperatures which do not exceed the temperature at which the nuclei dissolve may be preferred as less time is required to achieve a significant activation effect at higher temperatures. Accordingly, the activation temperature may be at least about 400° C., at least about 450° C., at least about 500° C. or even at least about 550° C. (e.g., from about 400° C. to about 600° C., from about 450° C. to about 600° C. or from about 500° C. to about 600° C.). Generally, the heat treatment between 400° C. and 600° C. may be performed for at least about 1 hour, with anneals of at least about 2 hours being typical (e.g., from about 1 hour to about 4 hours or from about 2 hours to about 4 hours). At lower temperatures (e.g., from about 400° C. to about 450° C.) longer heat treatments may be used to sufficiently activate inactive oxygen precipitate nuclei such as treatments of at least about 10 hours, at least about 20 hours, at least about 30 hours, at least about 40 hours or even at least about 50 hours or more (e.g., from about 1 hour to about 50 hours or from about 10 hours to about 50 hours).

The activation heat treatment $S_3$ may be conducted in the same atmosphere as the thermal anneal step $S_1$ and/or cooling step $S_2$. Suitable atmospheres include, for example argon, helium, neon, carbon dioxide, and other such inert elemental and compound gases, or mixtures of such gases (which may or may not contain oxygen).

In this regard, it should be understood that the activation heat treatment $S_3$ results in activation of at least a portion of the inactive oxygen precipitate nuclei in the wafer. As the heat treatment progresses, the activation effect levels off. For example, at temperatures of about 500° C., further activation is not observed after about 4 to about 5 hours of heat treatment. For purposes of the present disclosure, "substantially all" inactive precipitate nuclei are activated when the density of oxygen precipitates (measured as bulk micro defects) at the radial center of the wafer does not increase at least about 10% upon application of another 1 hour of heat treatment.

Upon activation of the inactive oxygen precipitate nuclei, upon being subjected to the heat treatment cycles of essentially any arbitrary electronic device manufacturing process, the wafer forms oxygen precipitates in the bulk and a precipitate-free zone near the surface with the density of oxygen precipitates in the bulk being higher than wafers in which an activation process was not performed. Any manufacturing process in excess of about 650° C. may be used to reliably form oxygen precipitate nuclei. In some embodiments, a standard oxygen precipitation heat treatment is performed for purposes of comparing the amount of precipitates that form after the wafer is subjected to different heat treatments. One typical oxygen precipitation heat treatment is a NEC1 oxygen precipitation heat treatment in which the wafer is heated to a temperature of 800° C. for four hours and then at a temperature of 1000° C. for sixteen hours.

In this regard, wafers that have been subjected to an oxygen precipitate nuclei activation process have been found to contain a higher density of oxygen precipitates upon an oxygen precipitation heat treatment (see Examples 1 and 2). For example, when the wafer has been cooled at a rate of 50° C. per second or less, the wafer may form a density of oxygen precipitates of at least about $7.5 \times 10^{10}$ cm$^{-3}$ or at least about $9.0 \times 10^{10}$ cm$^{-3}$ or at least about $1.0 \times 10^{11}$ cm$^{-3}$ upon a NEC1 oxygen precipitation heat treatment which is substantially higher (e.g., at least about 10%, at least about 20% or even at least about 30% higher) than wafers in which the activation heat treatment was not performed.

D. Epitaxial Layer

In some embodiments of the present disclosure, an epitaxial layer is deposited upon the surface of an ideal precipitating wafer produced according to an embodiment of the present disclosure (e.g., in which inactive vacancies have been activated) and, in other embodiments, the ideal precipitation process and activation may be carried out after the epitaxial layer is deposited. The epitaxial layer will be formed by means conventionally known and used by those skilled in the art such as decomposition of a gas phase, silicon-containing composition. In some embodiments, the surface of the wafer is exposed to an atmosphere comprising a volatile gas comprising silicon (e.g., $SiCl_4$, $SiHCl_3$, $SiH_2Cl_2$, $SiH_3Cl$ or $SiH_4$). The atmosphere may also contain a carrier gas (preferably $H_2$). In some embodiments, the source of silicon during the epitaxial deposition is $SiH_2Cl_2$ or $SiH_4$. If $SiH_2Cl_2$ is used, the reactor vacuum pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air or other gases leaking into the reactor chamber is lessened.

During the epitaxial deposition, the wafer surface preferably is maintained at a temperature sufficient to prevent the atmosphere comprising silicon from depositing polycrystalline silicon onto the surface. Preferably, the surface is maintained at a temperature of at least about 800° C., more preferably about 900° C., and most preferably about 1100° C. The rate of growth of the epitaxial deposition preferably is from about 0.5 to about 7.0 μm/min. A rate of from about 3.5 μm/min to about 4.0 μm/min may be achieved, for example, by using an atmosphere consisting essentially of about 2.5 mole % $SiHCl_3$ and about 97.5 mole % $H_2$ at a temperature of about 1150° C. and pressure of about 1 atmosphere.

If desired, the epitaxial layer may additionally include a p-type or n-type dopant. For example, it is often preferable for the epitaxial layer to contain boron. Such a layer may be prepared by, for example, including $B_2H_6$ in the atmosphere during the deposition. The mole fraction of $B_2H_6$ in the atmosphere used to obtain the desired properties (e.g., resistivity) will depend on several factors, such as the amount of boron out-diffusion from the particular substrate during the epitaxial deposition, the quantity of p-type dopants and n-type dopants that are present in the reactor and substrate as contaminants, and the reactor pressure and temperature. For high resistivity applications, the dopant concentration in the epitaxial layer is preferably as low as practical (the substrate wafer of the present disclosure optionally having a high or low resistivity, or a respective resistivity greater than or less than about 50 ohm cm).

E. Silicon on Insulator Structure

Wafers prepared in accordance with embodiments of the present disclosure may also be incorporated into a silicon on insulator structure. A silicon on insulator structure generally comprises a device layer, a handle wafer or supporting layer, and an insulating film or layer (typically an oxide layer) between the supporting layer and the device layer. Generally, the device layer is between about 0.5 and about 20 μm thick. Silicon on insulator structures may be prepared using various techniques known in the art, as further described herein below.

If the support layer of the SOI structure comprises or is derived from a wafer of the present disclosure, preferably the process (e.g., creating a template for oxygen precipitation and activation of inactive oxygen precipitate nuclei) will be carried out before the device layer of the SOI structure has been attached to the handle wafer (or, in the case of ion implantation processes, before implantation occurs). If the present process is carried out prior to formation of the SOI structure, it may be desirable to stabilize the oxygen precipitate nucleation centers in the handle wafer after the process is complete and before preparation of the SOI structure begins. Additionally, if this approach is employed, the oxygen precipitation heat treatment of step $S_2$ may, in some embodiments, be achieved during formation of the SOI structure (such as in the case of wafer bonding), provided the treatment time and temperature employed by the SOI process are sufficient for oxygen precipitate formation.

It is to be further noted, however, that the present silicon wafer process may also be performed after the SOI structure has been prepared. Without being held to any particular theory, it is believed that the SOI structure will behave as a typical single crystal silicon wafer, with the oxide layer acting as a free surface from which vacancies and self-interstitials may be injected and to which they may diffuse.

SOI structures may be prepared, for example, by the SIMOX process by subjecting the wafer of the present disclosure to an ion implantation process which, as noted above, is standard in the art as disclosed in U.S. Pat. No. 5,436,175 and Plasma Immersion Ion Implantation for Semiconductor Processing, Materials Chemistry and Physics 46 (1996) 132-139, both of which are incorporated herein by reference for all relevant and consistent purposes. In such a process, the ions are implanted into a silicon wafer substrate which is then subjected to a high temperature anneal to form a buried oxide, insulating layer. If, for example, oxygen ions are implanted, a buried insulating layer of silicon dioxide ($SiO_2$) is formed. If nitrogen atoms are implanted, a buried layer of silicon nitride ($Si_3N_4$) is formed. In such instances, the resulting SOI structure comprises a device layer and an insulating layer, both derived from a wafer produced by a method of the present disclosure. Because of the high temperature oxide formation anneal, typically about 1150° C. to about 1400° C., oxygen solubility exceeds the typical oxygen concentration in the wafer so that preexisting precipitates may dissolve back into interstitial oxygen. In such instances, for some application an oxygen reduction secondary anneal may be performed following the SIMOX process. This embodiment, then, typically comprises performing the rapid thermal anneal and cooling process on a single crystal silicon wafer having essentially any oxygen concentration attainable using Cz crystal pulling techniques; forming an oxide insulating layer in the wafer; and performing a secondary anneal at a temperature in the range of about 700° C. to about 1100° C.

SOI structures may also be prepared by bonding two wafers and removing a portion of one of the bonded wafers. For example, SOI structures can be prepared by the BESOI process, wherein the wafer of the present disclosure is bonded to another wafer, and then a substantial portion of one of the wafers is etched away using known wafer thinning techniques to obtain the device layer as disclosed in U.S. Pat. Nos. 5,024,723 and 5,189,500, each of which is incorporated herein by reference for all relevant and consistent purposes. In this instance, the resulting SOI structure comprises (i) a device layer, (ii) a handle wafer or supporting layer, and (iii) an insulating layer between the device layer and the support layer.

In an alternative wafer bonding approach, hydrogen or another ion is implanted into one of the wafers and, after the two wafers are bonded, the bonded composite is subjected to a force which causes the bonded composite to cleave at the implantation site. For example, a SOI structure may be prepared by (1) the implantation of ions (e.g., hydrogen, nitrogen, etc.) in a wafer of the present disclosure by bombardment to produce a layer of gaseous microbubbles, while keeping the temperature below the temperature at which the gaseous microbubbles can escape therefrom by diffusion, (2) contacting the planar face of the wafer with a stiffener to form a bonded composite, and (3) subjecting the bonded composite to a thermal or mechanical stress which causes the wafer of the present disclosure to delaminate in the region of ion implantation. If thermal stress is used, the composite is heated to a temperature above that which the implantation of ions occurred in order to create a crystalline rearrangement and a pressure effect in the microbubbles resulting in a separation between the thin semiconductor film and the majority of the substrate as disclosed in U.S. Pat. No. 5,374,564 which is incorporated herein by reference for all relevant and consistent purposes. If the SOI structure is to comprise a wafer of the present disclosure as a stiffener, in one or more embodiments, the wafer is subjected to the ideal precipitating process described above before bonding to the planar face of the other wafer. In other embodiments, the low defect density silicon wafer may first be bound to a Czochralski-type single crystal silicon wafer, and then the entire SOI structure may be subjected to the ideal precipitating process and nuclei activation process described above.

EXAMPLES

Example 1

Determination of the Effect of Subjecting Silicon Wafers to an Oxygen Precipitate Nuclei Activation Process Prior to an Oxygen Precipitation Heat Treatment A number of wafers with an oxygen content of 13 ppma were heated in a rapid thermal anneal process to install a concentration of vacancy-containing oxygen precipitate nuclei (both active and inactive nuclei) with the maximum concentration of nuclei being in the bulk region with the concentration generally decreasing in the direction of the front surface of the wafer. The rapid thermal anneal included heating the wafers to 1300° C. for 10 seconds followed by cooling at 50 K/sec, 15 K/sec, 8 K/sec or 2 K/sec. Several of the wafers were then heated to 500° C. for four hours to activate inactive oxygen precipitate nuclei. BMD density and depths at which the first, second and tenth BMD could be found were determined for both the wafers that were subjected to the activation process and the wafers that were not subjected to the activation process after a NEC1 test (anneal at a temperature of 800° C. for four hours and then at a temperature of 1000° C. for sixteen hours). The results are shown in Table 1 below.

TABLE 1

BMD and Denuded Zone Depths of Wafers Subjected to a 500° C. Four Hour Activation Heat Treatment and Wafers not subjected to Such a Heat Treatment

| RTA Cooling Rate (K/sec) | Activation Process (500° C. for 4 hours) | BMD (BMD/cm$^3$) | Denuded Zone Depth (1$^{st}$) (μm) | Denuded Zone Depth (2$^{nd}$) (μm) | Denuded Zone Depth (10$^{th}$) (μm) |
|---|---|---|---|---|---|
| 50 | No  | $5.6 \times 10^{10}$ | 55 | 55 | 62 |
| 15 | No  | $4.7 \times 10^{9}$  | 106 | 109 | 136 |
| 8  | No  | $4.7 \times 10^{7}$  | nd | nd | nd |
| 2  | No  | $2.5 \times 10^{7}$  | nd | nd | nd |
| 50 | Yes | $1.4 \times 10^{11}$ | 22 | 23 | 33 |
| 15 | Yes | $5.5 \times 10^{10}$ | 26 | 30 | 37 |
| 8  | Yes | $1.6 \times 10^{10}$ | 23 | 25 | 68 |
| 2  | Yes | $3.1 \times 10^{9}$  | 56 | 57 | 81 |

(nd = not detected)

As can be seen from Table 1, out-diffusion of oxygen precipitate nuclei at cooling rates of 2 K/sec and 8 K/sec prevented precipitates from forming in the bulk of the wafer for wafers in which inactive nuclei were not activated. In contrast, the wafers in which inactive nuclei were activated contained oxygen precipitates at cooling rates of 8 K/sec and 2 K/sec.

Further, the wafers in which inactive nuclei were activated contained significantly more oxygen precipitates (measured as BMD). It is expected that some conventional nucleation occurs at 500° C.; however for this oxygen concentration, the expected additional precipitation due to conventional nucleation is less that $1 \times 10^{8}$ BMD/cm$^3$. At a cooling rate of 50 K/sec which is typical for denuded zone applications, the bulk precipitate density increased to about $1 \times 10^{11}$ BMD/cm$^3$ and the denuded zone decreased to about 20 μm.

It can also be observed from Table 1 that reducing the cooling rate does not affect the wafers which were heated at 500° C. for four hours as much as the wafers that were not subjected to the activation heat treatment. This may be explained by a reduction in diffusion for nuclei that were activated (i.e., previously inactive nuclei) relative to nuclei that were active regardless of the 500° C. heat treatment.

Example 2

Time Dependence of the Activation Process

Figure 2:
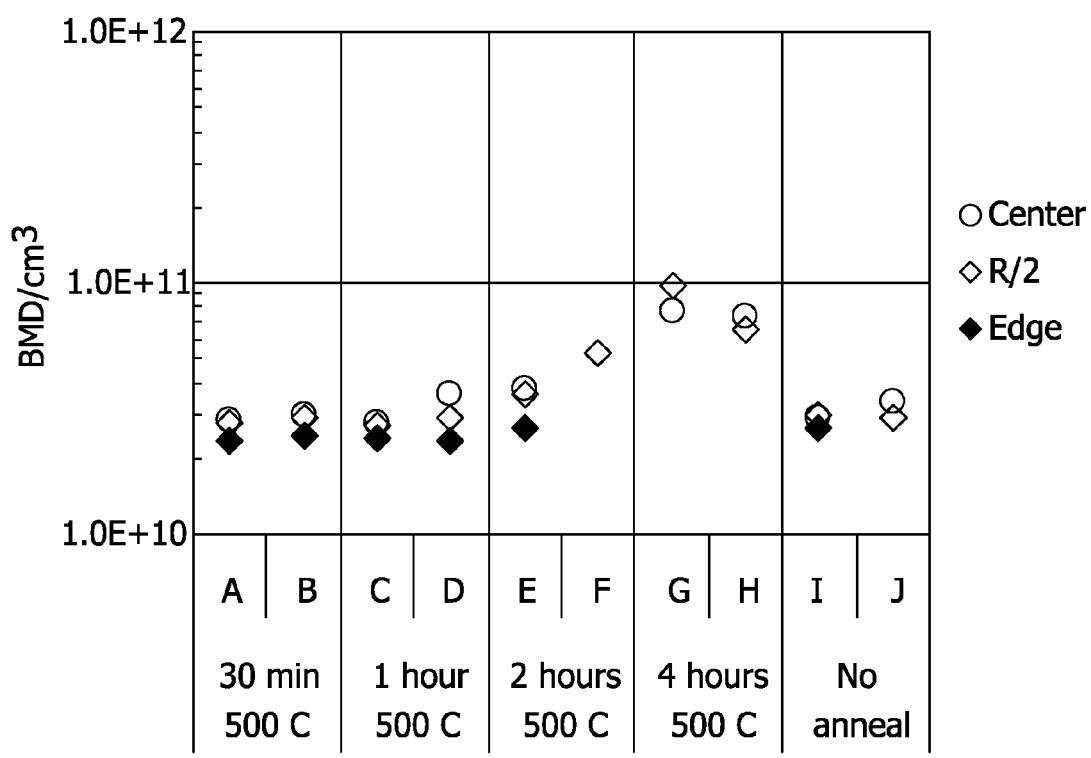
FIG. 2 is a graph showing the density of bulk microdefects in wafers subjected to 500° C. heat treatments for various periods of time according to Example 2.
Figure 3:
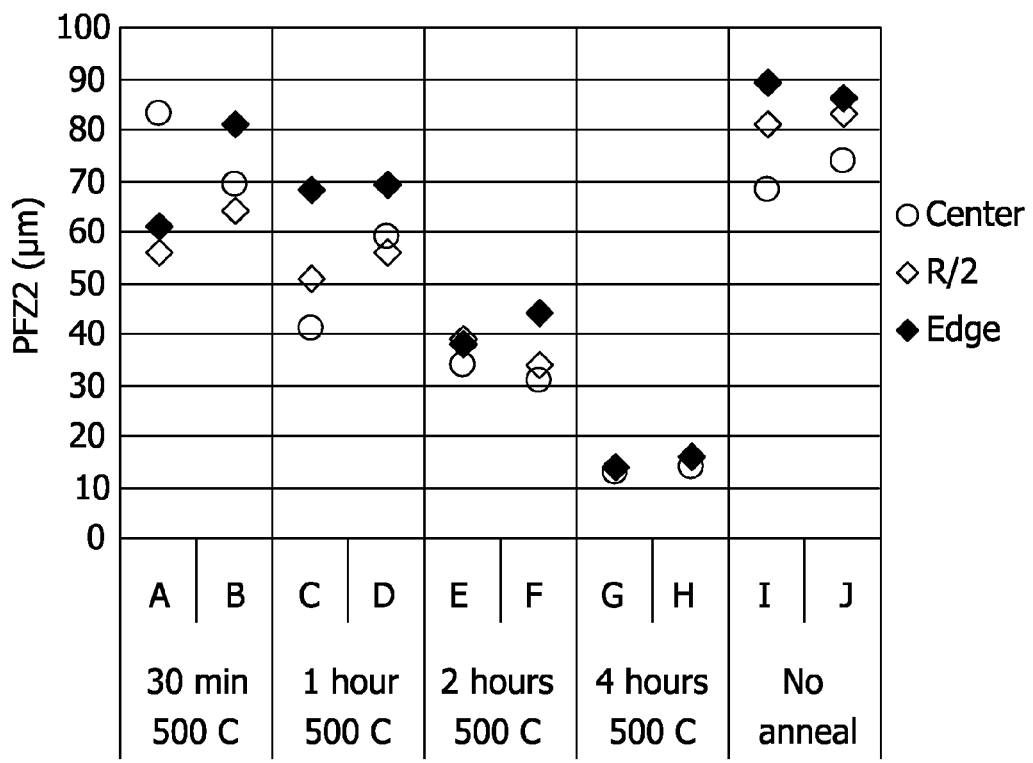
FIG. 3 is a graph showing the denuded zone depth for wafers subjected to 500° C. heat treatments for various periods of time according to Example 2.

The time required to activate inactive vacancy-containing oxygen precipitation nuclei was determined by varying the time of the 500° C. heat treatment. The set of wafers was subjected to a rapid thermal anneal of 1230° C. for 10 seconds in an argon atmosphere with a cooling rate of 50 K/sec. The results can be seen in FIGS. 2 and 3. As can be seen from FIGS. 2 and 3, a significant increase in BMD's can be seen at 2 hours of heating and after 4 hours the density of BMD increased to about $1 \times 10^{11}$ BMD/cm$^3$ and the depth of the denuded zone was decreased to about 15 µm.

As used herein, the terms "about," "substantially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the disclosure, it is intended that all matter contained in the above description and shown in the accompanying figures shall be interpreted as illustrative and not in a limiting sense.

What is claimed is:

1. A process for heat-treating a single crystal silicon wafer sliced from a single crystal silicon ingot grown by the Czochralski method to influence the precipitation behavior of oxygen in the wafer in a subsequent thermal processing step, the silicon wafer having a front surface, a back surface, a central plane between the front and back surfaces, a front surface layer which comprises the region of the wafer extending in the axial direction from the front surface toward the central plane to a distance, D, from the front surface, and a bulk layer which comprises the region of the wafer between the central plane and front surface layer, the process comprising:
   subjecting the wafer to a heat-treatment to install in the wafer a concentration of oxygen precipitate nuclei comprising crystal lattice vacancies in the front surface and bulk layers of the wafer, wherein at least a portion of the oxygen precipitate nuclei are inactive oxygen precipitate nuclei and a portion are active oxygen precipitate nuclei, the oxygen precipitate nuclei being characterized such that upon being subjected to an NEC1 oxygen precipitation heat treatment active oxygen precipitate nuclei are converted to oxygen precipitates and inactive oxygen precipitate nuclei do not form oxygen precipitates;
   controlling the cooling rate of the heat-treated wafer to produce a wafer having a concentration profile of oxygen precipitate nuclei wherein the maximum concentration is in the bulk region with the concentration generally decreasing in the direction of the front surface of the wafer and the difference in the concentration of oxygen precipitate nuclei in the front surface and bulk layers being such that, if the wafer is subjected to a subsequent oxygen precipitation heat treatment, an oxygen precipitate-free denuded zone is formed in the front surface layer and oxygen precipitates are formed in the bulk layer with the concentration of the oxygen precipitates in the bulk layer being primarily dependent upon the oxygen precipitate nuclei; and
   subjecting the wafer to a heat treatment at a temperature of at least about 400° C. and no greater than about 600° C. for at least about 1 hour to activate at least a portion of the inactive oxygen precipitate nuclei in the wafer.

2. The process as set forth in claim 1 wherein the heat treatment to activate at least a portion of the inactive oxygen precipitate nuclei is at a temperature of at least about 500° C.

3. The process as set forth in claim 1 wherein the heat treatment to activate at least a portion of the inactive oxygen precipitate nuclei is performed for at least about 2 hours.

4. The process as set forth in claim 1 wherein the heat treatment to activate at least a portion of the inactive oxygen precipitate nuclei is at a temperature of from about 400° C. to about 450° C. and the treatment is performed for at least about 10 hours.

5. The process as set forth in claim 1 wherein the heat-treatment to install in the wafer a concentration of oxygen precipitate nuclei comprising crystal lattice vacancies in the front surface and bulk layers of the wafer is at a temperature of at least about 1100° C.

6. The process as set forth in claim 1 wherein the heat-treatment to install in the wafer a concentration of oxygen precipitate nuclei comprising crystal lattice vacancies in the front surface and bulk layers of the wafer is at a temperature of from about 1100° C. to about 1200° C.

7. The process as set forth in claim 5 wherein the heat-treatment to install in the wafer a concentration of oxygen precipitate nuclei comprising crystal lattice vacancies in the front surface and bulk layers is performed for about 1 second to about 60 seconds.

8. The process as set forth in claim 1 wherein the average cooling rate is at least about 5° C. per second.

9. The process as set forth in claim 1 wherein substantially all of the inactive oxygen precipitate nuclei in the wafer are activated.

10. The process as set forth claim 1 wherein the wafer is cooled at a rate of about 50° C. per second or less and the wafer is capable of forming a density of oxygen precipitates of at least about $7.5 \times 10^{10}$ cm$^{-3}$ upon a NEC1 oxygen precipitation heat treatment.

11. The process as set forth in claim 1 comprising subjecting the wafer to an oxygen precipitation heat treatment step.

12. The process as set forth in claim 11 wherein the oxygen precipitation heat treatment is a process involved in electronic device manufacturing.

13. The process as set forth in claim 1 wherein the heat treatment to activate at least a portion of the inactive oxygen precipitate nuclei is performed in an ambient selected from argon, helium, neon, carbon dioxide and mixtures thereof.

14. The process as set forth in claim 1 wherein D is at least about 10 µm.

15. A process for activating inactive oxygen precipitate nuclei, which comprise crystal lattice vacancies, in a wafer sliced from a single crystal silicon ingot grown by the Czochralski method and having a front surface, a back surface, a central plane between the front and back surfaces, a front surface layer which comprises the region of the wafer extending in the axial direction from the front surface toward the central plane to a distance, D, from the front surface, and a bulk layer which comprises the region of the wafer between the central plane and front surface layer, the wafer having a concentration of oxygen precipitate nuclei comprising crystal lattice vacancies in the front surface and bulk layers of the wafer, wherein at least a portion of the oxygen precipitate nuclei are inactive oxygen precipitate nuclei and a portion are active oxygen precipitate nuclei, the oxygen precipitate nuclei being characterized such that upon being subjected to an NEC1 oxygen precipitation heat treatment active oxygen precipitate nuclei are converted to oxygen precipitates and inactive oxygen precipitate nuclei do not form oxygen precipitates, wherein the concentration profile of the oxygen precipitate nuclei is characterized such that the maximum concentration is in the bulk region with the concentration generally decreasing in the direction of the front surface of the wafer, the process comprising:

subjecting the wafer to a heat treatment at a temperature of at least about 400° C. and no greater than about 600° C. for at least about 1 hour to activate the inactive oxygen precipitate nuclei such that they are capable of forming oxygen precipitates upon being subjected to an NEC1 oxygen precipitate heat treatment.

16. The process as set forth in claim 15 wherein the heat treatment to activate at least a portion of the inactive oxygen precipitate nuclei is at a temperature of at least about 450° C.

17. The process as set forth in claim 15 wherein the heat treatment to activate at least a portion of the inactive oxygen precipitate nuclei is performed for at least about 2 hours.

18. The process as set forth in claim 15 wherein the heat treatment to activate at least a portion of the inactive oxygen precipitate nuclei is at a temperature of from about 400° C. to about 450° C. and the treatment is performed for at least about 10 hours.

19. The process as set forth in claim 15 wherein substantially all of the inactive oxygen precipitate nuclei in the wafer are activated.

20. The process as set forth in claim 15 comprising subjecting the wafer to an oxygen precipitation heat treatment step.

21. The process as set forth in claim 20 wherein the oxygen precipitation heat treatment is a process involved in electronic device manufacturing.

22. The process as set forth in claim 15 wherein the heat treatment to activate at least a portion of the inactive oxygen precipitate nuclei is performed in an ambient selected from argon, helium, neon, carbon dioxide and mixtures thereof.

23. The process as set forth in claim 15 wherein D is at least about 20 μm.

* * * * *